United States Patent
Sharma et al.

(10) Patent No.: US 6,693,825 B1
(45) Date of Patent: Feb. 17, 2004

(54) MAGNETO-RESISTIVE DEVICE INCLUDING CLAD CONDUCTOR

(75) Inventors: Manish Sharma, Mountain View, CA (US); Thomas C. Anthony, Sunnyvale, CA (US); Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 22 days.

(21) Appl. No.: 10/349,685

(22) Filed: Jan. 23, 2003

Related U.S. Application Data

(63) Continuation of application No. 10/235,011, filed on Sep. 3, 2002, now Pat. No. 6,577,529.

(51) Int. Cl.[7] .............................................. G11C 11/00
(52) U.S. Cl. ....................................... 365/158; 365/171
(58) Field of Search ................................. 365/158, 171, 365/173; 257/421, 422

(56) References Cited

U.S. PATENT DOCUMENTS

| | | | |
|---|---|---|---|
| 6,351,409 B1 * | 2/2002 | Rizzo et al. | 365/158 |
| 6,404,674 B1 * | 6/2002 | Anthony et al. | 365/173 |
| 6,504,221 B1 * | 1/2003 | Tran et al. | 257/421 |
| 6,538,917 B1 * | 3/2003 | Tran et al. | 365/158 |
| 6,593,608 B1 * | 7/2003 | Sharma et al. | 257/295 |

* cited by examiner

*Primary Examiner*—Son T. Dinh

(57) ABSTRACT

A memory cell includes a conductor clad with ferromagnetic material; first and second spacer layers on opposite sides of the clad conductor; a first data layer on the first spacer layer; and a second data layer on the second spacer layer.

15 Claims, 11 Drawing Sheets

MAGNETO-RESISTIVE DEVICE INCLUDING CLAD CONDUCTOR

CROSS REFERENCE TO RELATED APPLICATION(S)

This is a continuation of application Ser. No. 10/235,011 filed on Sep. 3, 2002 now U.S. Pat. No. 6,577,529 which is hereby incorporated by reference herein.

BACKGROUND

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line.

The memory cells may be based on tunneling magneto-resistive (TMR) devices such as spin dependent tunneling (SDT) junctions. A typical SDT junction includes a pinned layer, a sense layer and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions: the same direction as the pinned layer magnetization, or the opposite direction of the pinned layer magnetization. If the magnetizations of the pinned and sense layers are in the same direction, the orientation of the SDT junction is said to be "parallel." If the magnetizations of the pinned and sense layers are in opposite directions, the orientation of the SDT junction is said to be "anti-parallel." These two stable orientations, parallel and anti-parallel, may correspond to logic values of '0' and '1.'

The magnetization orientation of the pinned layer may be fixed by an underlying antiferromagnetic (AF) pinning layer. The AF pinning layer provides a large exchange field, which holds the magnetization of the pinned layer in one direction. Underlying the AF layer are usually first and second seed layers. The first seed layer allows the second seed layer to be grown with a (111) crystal structure orientation. The second seed layer establishes a (111) crystal structure orientation for the AF pinning layer.

DETAILED DESCRIPTION

Figure 1:
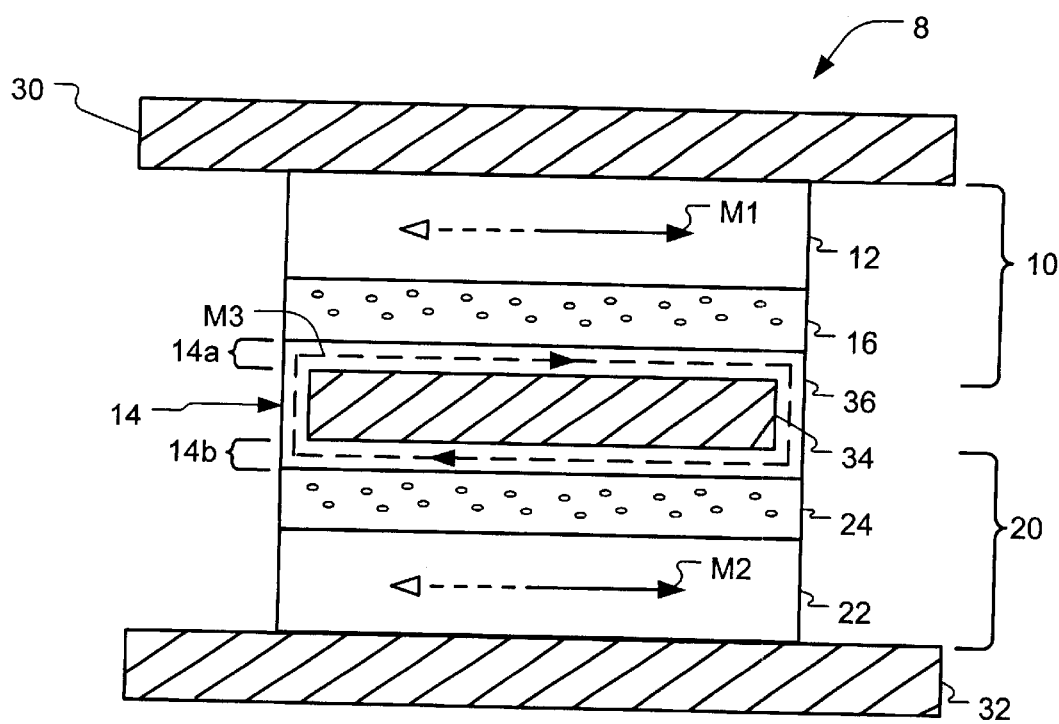
FIG. 1 is an illustration of a magnetic memory device according to an embodiment of the present invention.

Reference is made to FIG. 1, which illustrates a magnetic memory device 8 including first and second magnetic tunnel junctions 10 and 20. The first magnetic tunnel junction 10 includes a first data layer 12, an upper portion 14a of a reference layer 14, and a first insulating tunnel barrier 16 between the data layer 12 and the upper portion 14a. The first data layer 12 is made of a ferromagnetic material and has a magnetization (represented by the vector M1) that can be oriented in either of two directions, typically along its easy axis (one direction is shown in solid, and the other direction is shown in dashed). The upper portion 14a of the reference layer 14 is also made of a ferromagnetic material and has a magnetization (represented by the vector M3) that can be oriented in either of two directions, typically along its easy axis. The easy axes of the first data layer 12 and the upper portion 14a of the reference layer 14 extend in the same direction.

Figure 1A:
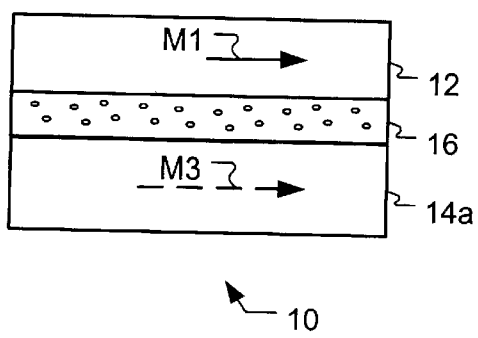
FIGS. 1a and 1b are illustrations of different magnetization orientations of the magnetic memory device.

If the magnetizations vectors (M1 and M3) of the first data layer 12 and the upper portion 14a of the reference layer 14 are pointing in the same direction, the orientation of the first magnetic tunnel junction 10 is said to be "parallel" (see FIG. 1a). If the magnetization vectors (M1 and M3) of the first data layer 12 and the upper portion 14a of the reference layer 14 are pointing in opposite directions, the orientation of the first magnetic tunnel junction 10 is said to be "anti-parallel" (see FIG. 1b). These two stable orientations, parallel and anti-parallel, may correspond to logic values of '0' and '1.'

The first insulating tunnel barrier 16 allows quantum mechanical tunneling to occur between the first data layer 12 and the upper portion 14a of the reference layer 14. This tunneling phenomenon is electron spin dependent, causing the resistance of the first magnetic tunnel junction 10 to be a function of the relative orientations of the magnetization vectors (M1 and M3) of the first data layer 12 and the upper portion 14a of the reference layer 14. For instance, resistance of the first magnetic tunnel junction 10 is a first value (R) if the magnetization orientation of the magnetic tunnel junction 10 is parallel and a second value (R1+ΔR1) if the magnetization orientation is anti-parallel. The first insulating tunnel barrier 16 may be made of aluminum oxide ($Al_2O_3$), silicon dioxide ($SiO_2$), tantalum oxide ($Ta_2O_5$), silicon nitride ($Si_3N_4$), aluminum nitride (AlN), or magnesium oxide (MgO). Other dielectrics and certain semiconductor materials may be used for the first insulating tunnel barrier 16. Thickness of the insulating tunnel barrier 16 may range from about 0.5 nanometers to about three nanometers.

Figure 1B:
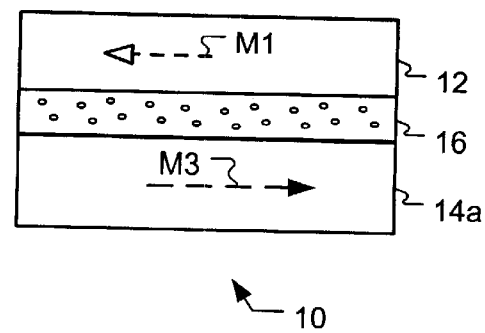

Consider a first magnetic tunnel junction 10 having a nominal resistance (R1) of 1 Mohm, and a tunneling magneto-resistance of 30%. If the first data layer magnetization vector (M1) is pointing to the left, and the upper portion magnetization vector (M3) is pointing to the right (as shown in FIG. 1b), the magnetization orientation of the magnetic tunnel junction 10 will be anti-parallel, and the resistance of the magnetic tunnel junction 10 will be R1+ΔR1 or 1.3 Mohms. If the data layer magnetization vector (M1) and the reference layer magnetization vector (M3) are both pointing to the right (as shown in FIG. 1a), the magnetization orientation of the magnetic tunnel junction 10 will be parallel, and the resistance of the magnetic tunnel junction 10 will be R1=1.0 Mohms.

The second magnetic tunnel junction 20 includes a second data layer 22, a lower portion 14b of the reference layer 14, and a second insulating tunnel barrier 24 between the second data layer 22 and the lower portion 14b. The second tunnel junction 20 may have the same construction as the first magnetic tunnel junction 10. If it does, the second data layer 22 is made of a ferromagnetic material and has a magnetization (represented by the vector M2) that can be oriented in either of two directions, typically along its easy axis. The lower portion 14b of the reference layer 14 is also made of a ferromagnetic material, and has a magnetization (represented by the same vector M3) that can be oriented in either of two directions, typically along its easy axis. The second insulating tunnel barrier 24 allows quantum mechanical tunneling to occur between the second data layer 22 and the reference layer 14. Resistance of the second magnetic tunnel junction 20 is a function of the relative orientations of the magnetization vectors (M2 and M3) of the second data layer 12 and the lower portion of the reference layer 14.

A first electrical conductor 30 is in contact with the first data layer 12, and a second electrical conductor 32 is in contact with the second data layer 22. The reference layer 14 includes a third conductor 34. The conductors 30, 32 and 34 may be made of a material such as copper or aluminum. The first and second conductors 30 and 32 extend in the same direction. The third conductor 34 is roughly orthogonal to the first and second conductors 30 and 32.

The reference layer 14 further includes a ferromagnetic cladding 36 on the third conductor 34. The upper portion 14a of the reference layer 14 includes that part of the cladding 36 between third conductor 34 and the first insulating tunnel barrier 16. The lower portion 14b of the reference layer includes that part of the cladding 36 between third conductor 34 and the second insulating tunnel barrier 24. The depiction of the cladding thickness relative to the third conductor 34 is exaggerated. The thickness of the cladding 36 may be about 1 nm to 50 nm (with a typical value of 4 nm). Supplying a current to the third conductor 34 causes a magnetic field to be generated about the third conductor 34. If the current flows into the third conductor 34, the magnetic field causes the reference layer magnetization vector (M3) to point to in a clockwise direction about the third conductor 34 (as shown in FIG. 1). If the current flows in the opposite direction, the magnetic field causes the reference layer magnetization vector (M3) to point in a counter-clockwise direction about the third conductor 34. The magnetization points in one direction in the upper portion 14a and points in an opposite direction in the lower portion 14b. The cladding 36 provides a conductive path for the magnetic field.

Figure 2:
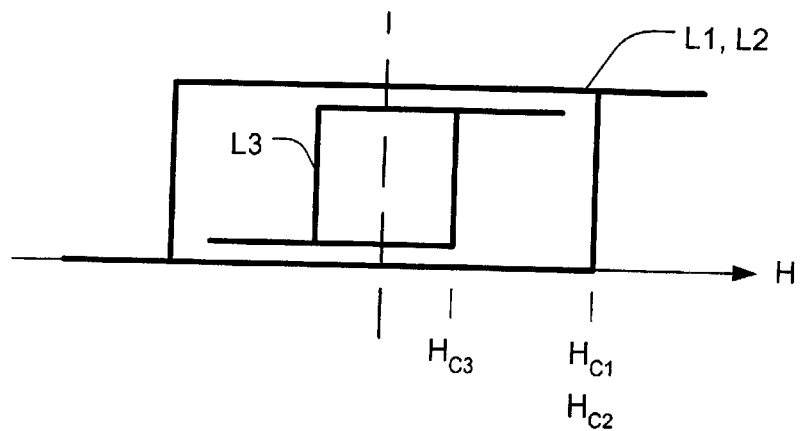
FIG. 2 is an illustration of hysteresis loops for data and reference layers of the magnetic memory device.

Additional reference is now made to FIG. 2, which shows hysteresis loops L1 and L2 for the first and second data layers 12 and 22. FIG. 2 also shows a hysteresis loop L3 for the upper and lower portions 14a and 14b of the reference layer 14. The first and second data layers 12 and 22 may have the same coercivity. That is, $H_{C1}=H_{C2}$. Coercivity ($H_{C1}$, $H_{C2}$) of the data layers 12 and 22 is much higher than coercivity ($H_{C3}$) of the reference layer portions 14a and 14b.

The data layer coercivity ($H_{C1}$, $H_{C2}$) may be at least 2–5 times greater than the coercivity ($H_{C3}$) of the reference layer portions 14a and 14b. For example, the data layer coercivity ($H_{C1}$, $H_{C2}$) may be about 25 Oe, and the reference layer coercivity ($H_{C3}$) may be about 5 Oe. Thus the reference layer portions 14a and 14b are considered "softer" than the data layers 12 and 22 because the reference layer magnetization vector (M3) is much easier to flip. It is preferred to make the coercivity ($H_{C3}$) of the reference layer portions 14a and 14b as low as possible.

Coercivities may be made different by using different bit shapes, geometries, compositions, thickness, etc. Potential ferromagnetic layer materials include nickel iron (NiFe), nickel iron cobalt (NiFeCo), cobalt iron (CoFe), other magnetically soft alloys of NiFe and Co, doped amorphous ferromagnetic alloys, and PERMALLOY™. For example, the data layers 12 and 22 may be made of a material such as NiFeCo or CoFe, and the cladding 36 may be made of a ferromagnetic material such as NiFe.

The magnetic tunnel junctions 10 and 20 may have the same resistance, but they are not so limited. The resistance of the magnetic tunnel junctions 10 and 20 may be made different by using different thickness and/or materials for the insulating tunnel barriers 16 and 24. Magnetic tunnel junctions having different resistances will be described below.

The magnetic tunnel junctions 10 and 20 may be operated as two independent bits. In this dual-bit configuration, the memory device 8 has four possible logic values: logic '00', logic '01', logic '10' and logic '11'. In the alternative, the magnetic tunnel junctions may be operated as bit-bitbar. In this bit-bitbar configuration, the memory device 8 has two possible logic values: logic '0' and logic '1' (if the first magnetic tunnel junction 10 stores a logic '1', the second magnetic tunnel junction 20 stores a logic '0'; if the first magnetic tunnel junction 10 stores a logic '0', the second magnetic tunnel junction 20 stores a logic '1'). The dual-bit configuration offers a higher storage density than the bit-bitbar configuration. However, the bit-bitbar configuration offers a self-referencing read operation that is faster to perform with better common mode noise rejection and better signal-to-noise ratio.

Figure 3:
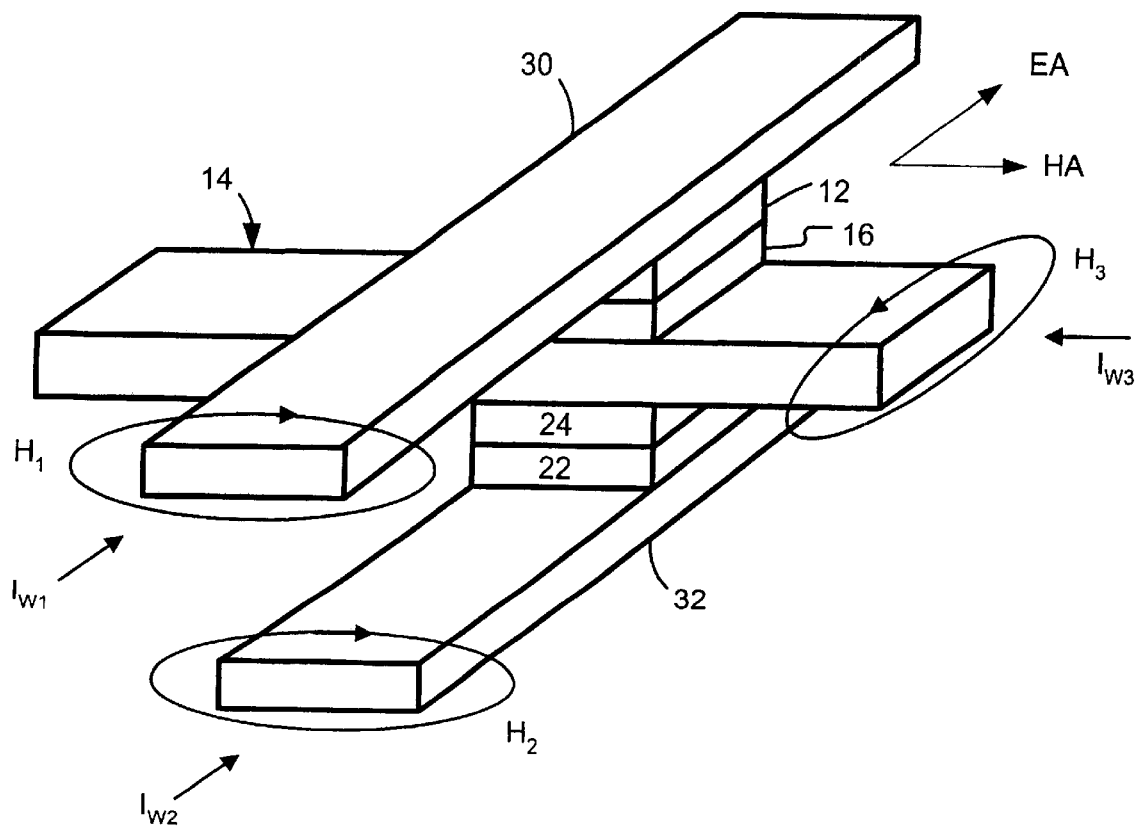
FIG. 3 is an illustration of a write operation on the magnetic memory device.

Reference is now made to FIG. 3. Write operations for the dual-bit configuration may be performed by supplying first, second and third write currents ($I_{W1}$, $I_{W2}$, $I_{W3}$) to the first, second, and third conductors 30, 32, and 34. The first, second, and third write currents ($I_{W1}$, $I_{W2}$, $I_{W3}$) create first, second and third magnetic fields ($H_1$, $H_2$, $H_3$) about the first, second and third conductors 30, 32 and 34, respectively. The first and third magnetic fields ($H_1+H_3$), when combined, exceed the coercivity ($H_{C1}$) of the first data layer 12 and, therefore, cause the magnetization vector (M1) of the first data layer 12 to be set in a desired orientation. The orientation of the first data layer magnetization vector (M1) determines the logic value stored in the first magnetic tunnel junction 10. The second and third magnetic fields ($H_2+H_3$), when combined, exceed the coercivity ($H_{C2}$) of the second data layer 22 and, therefore, cause the magnetization vector (M2) of the second data layer 22 to be set in a desired orientation. The orientation of the second data layer magnetization vector (M2) determines the logic value stored in the second magnetic tunnel junction 20.

The orientation of the first data layer magnetization vector (M1) may be set independently of the orientation of the second data layer magnetization vector (M2). Thus the combination of the first and third write currents ($I_{W1}$ and $I_{W3}$) may be applied independently of the combination of the second and third write currents ($I_{W2}$ and $I_{W3}$).

Write operations for the bit-bitbar configuration are also performed by supplying first, second and third write currents ($I_{W1}$, $I_{W2}$, $I_{W3}$) to the first, second, and third conductors 30, 32, and 34. The magnetization vectors (M1 and M2) of the first and second data layers 12 and 22 are made to point in the same direction (either to the left or right). During a read operation, the magnetization in the upper portion 14a of the reference layer 14 always points in an opposite direction of the magnetization in the lower portion 14b of the reference layer. As a result, the second magnetic tunnel junction 20 stores the complement of the logic value stored in the first magnetic tunnel junction 10.

For both configurations, the first and second magnetic tunnel junctions 10 and 20 may be written to sequentially. For example, either the first and second write currents ($I_{W1}$ or $I_{W2}$) is supplied to the first or second conductor 30 or 32, and the third write current ($I_{W3}$) is supplied to the third conductor 34 with a small delay (e.g., 20 ns). As a result, the hard axis field is applied first to take advantage of the higher torque it creates on the magnetization vectors (M1 and M2) aligned along the easy axis (the easy axis and the hard axis are indicated by arrows labeled EA and HA).

If the magnitudes of all three write currents are equal, the magnetic fields about the first and second conductors 30 and 32 will have a greater influence on the data layers 12 and 22 than the magnetic field about the third conductor 34 (because part of the magnetic field saturates the ferromagnetic cladding 36). The magnitude of the third write current ($I_{W3}$) can be made greater than the magnitude of the first and second write currents ($I_{W1}$, $I_{W2}$) in order to compensate for the saturation of the ferromagnetic cladding 36 and to produce a higher torque on the magnetization vectors (M1 and M2).

Read operations in general may be performed by supplying a read current to the third conductor 34. The read current causes a magnetic field to be generated about the third conductor 34. The magnetic field causes the magnetization in the upper portion 14a of the reference layer 14 to point in an opposite direction to the magnetization in the lower portion 14b of the reference layer 14. Since the coercivity ($H_{C3}$) of the reference layer 14 is low, the magnitude of the read current is low. Thus the resulting magnetic field does not affect the magnetization of the data layer 12 or 22.

Figure 4A:
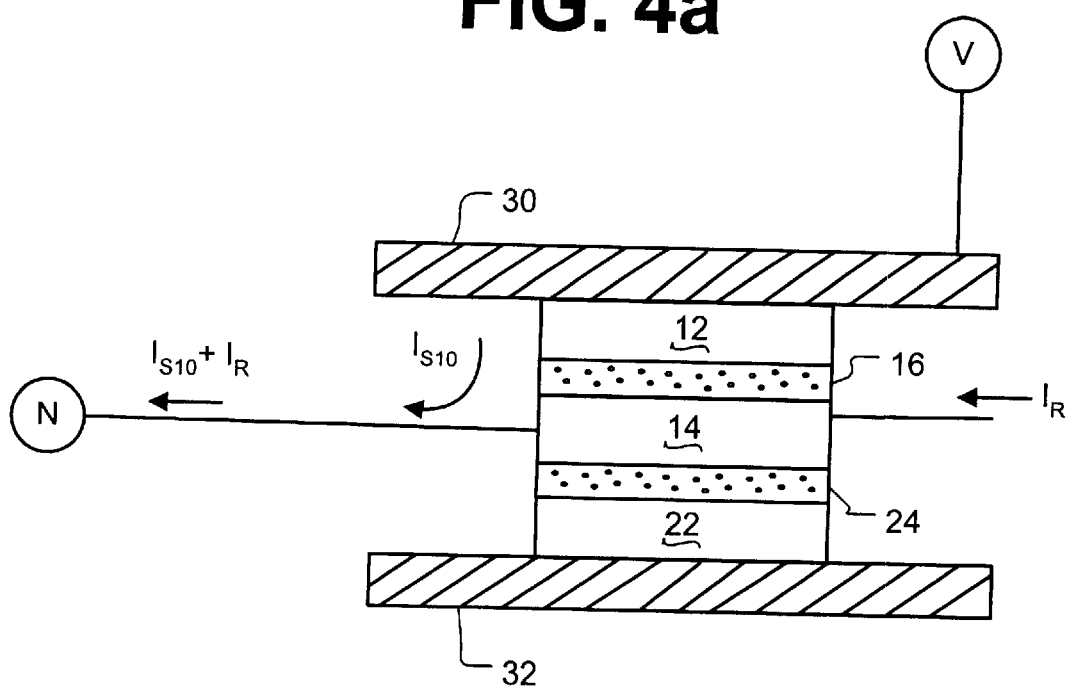
FIGS. 4a–4f are illustrations of read operations on the magnetic memory device according to embodiments of the present invention.
Figure 4B:
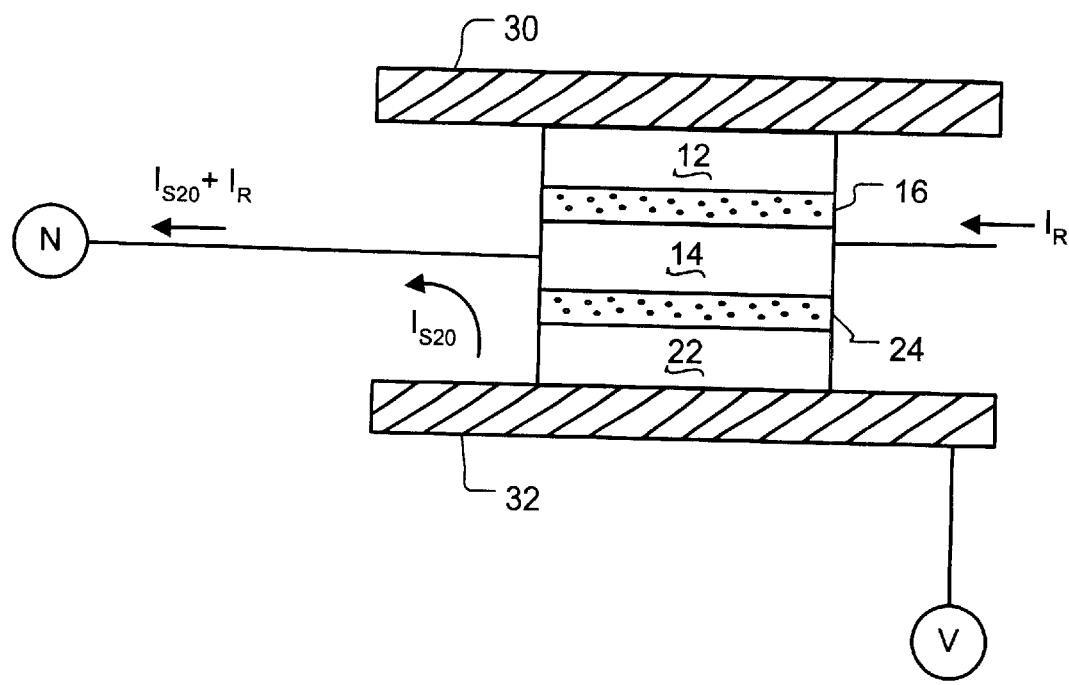

Reference is made to FIG. 4a. Read operations for the dual-bit configuration may be performed by reading one magnetic tunnel junction 10 or 20 and then the other magnetic tunnel junction. To read the first magnetic tunnel junction 10, a voltage (V) is applied between one end of the first conductor 30 and a node (N) on the third conductor 34. As a result, a sense current ($I_{S10}$) flows through the first magnetic tunnel junction 10. Simultaneously, a read current ($I_R$) is supplied to the third conductor 34. The read current ($I_R$) sets the magnetization vector (M3) of the reference layer 14. The sense and read currents ($I_{S10}+I_R$) flow into the node (N). Since the magnitude of the read current ($I_R$) is known, the magnitude of the sense current ($I_{S10}$), and hence the resistance and logic states of the first magnetic tunnel junction 10 can be determined. The sensed current ($I_{S10}$) is inversely proportional to the resistance of the first magnetic tunnel junction 10. Thus $I_{s10}=V/R1$ or $I_{s10}=V/(R1+\Delta R1)$. The logic state of the second magnetic tunnel junction 20 can be determined in a similar manner, as illustrated in FIG. 4b (where $I_{S20}$ represents the sense current flowing through the second magnetic tunnel junction 20).

Figure 4C:
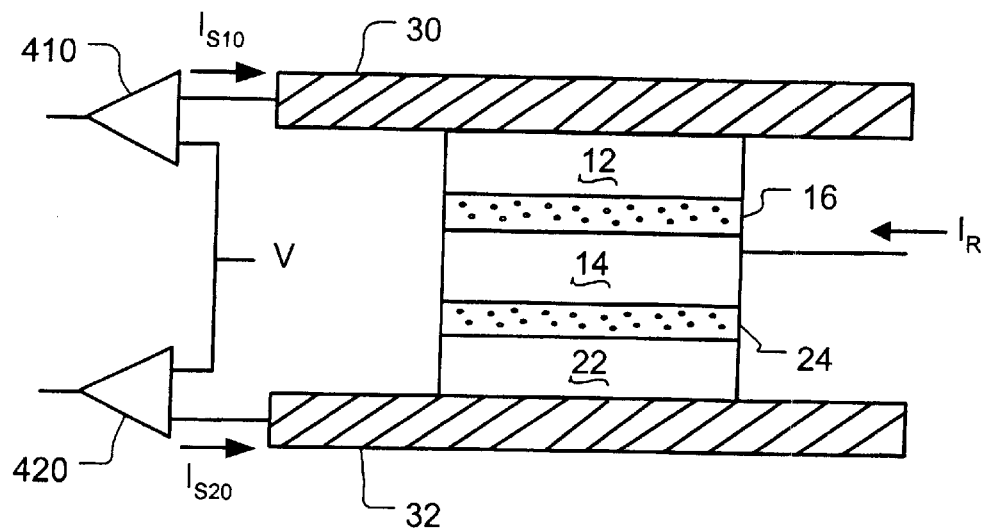

Both magnetic tunnel junctions 10 and 20 in the dual-bit configuration may be read simultaneously. FIG. 4c shows one way of reading both magnetic tunnel junctions 10 and 20 simultaneously. The first conductor 30 is connected to a first input of a first sense amplifier 410, and the second conductor 32 is connected to a first input of a second sense amplifier 420. When a voltage (V) is applied to second inputs of the sense amplifiers 410 and 420, the sense amplifiers 410 and 420 create bias voltages at their first inputs. These bias voltages cause sense currents ($I_{S10}$ and $I_{S20}$) to flow through the first and second magnetic tunnel junctions 10 and 20. The first sense amplifier 410 senses the current ($I_{S10}$) at its second input, and generates an output voltage that is proportional to the sense current ($I_{S10}$). The first sense amplifier output voltage indicates the resistance state of the first magnetic tunnel junction 10. The second sense amplifier 420 senses the current ($I_{S20}$) at its second input, and generates an output voltage that is proportional to the sense current ($I_{S20}$). The second sense amplifier output voltage indicates the resistance state of the second magnetic tunnel junction 20.

Figure 4D:
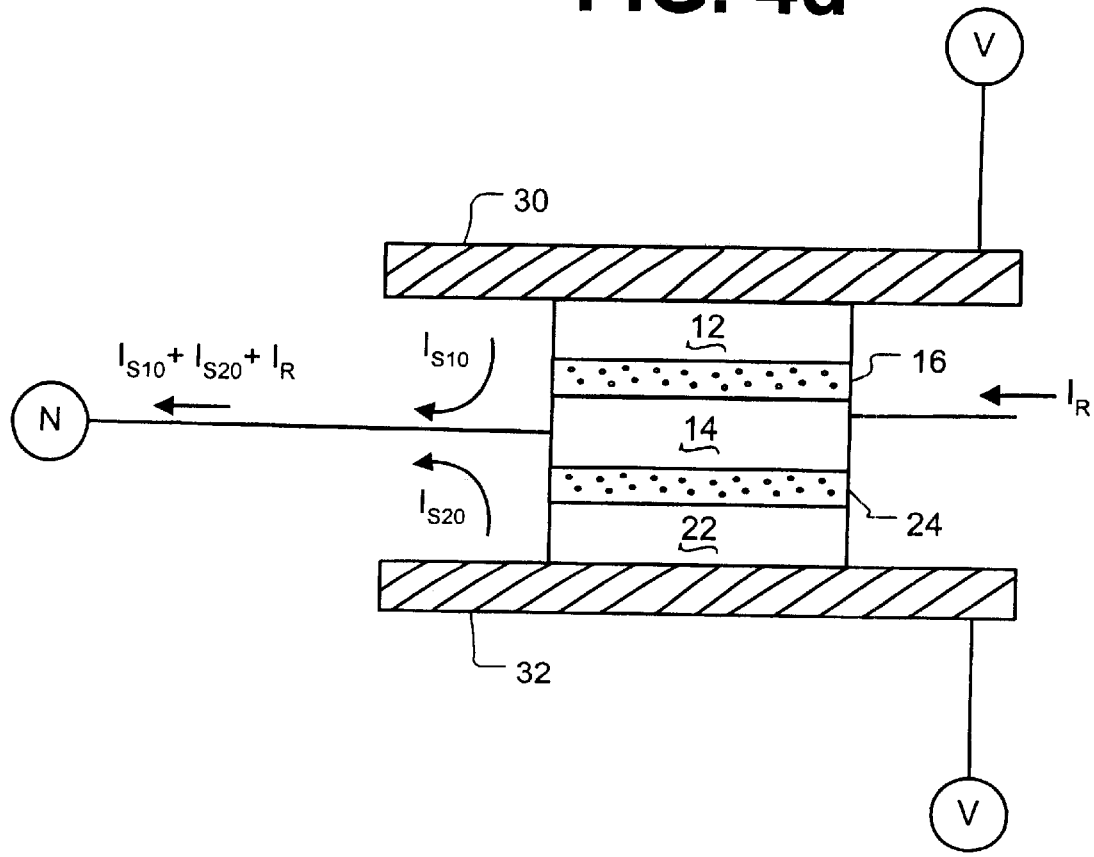

FIG. 4d shows another way of reading both magnetic tunnel junctions 10 and 20 simultaneously. The first magnetic tunnel junction 10 has two resistance states (R1, R1+$\Delta$R1), the second magnetic tunnel junction 20 has two resistance states (R2, R2+$\Delta$R2). During a read operation, a first potential (V) is applied to the first and second conductors 30 and 32, and the third conductor 34 is maintained at a potential that is lower than the first potential. As a result, a first sense current ($I_{S10}$) flows through the first magnetic tunnel junction 10 and into a node (N), and a second sense current ($I_{S20}$) flows through the second magnetic tunnel junction 10 and into the node (N). Measuring the sum of the currents ($I_{S10}+I_{S20}+I_R$) flowing into the node (N) allows the resistance state of the device 8 to be inferred. The inferred resistance state will be R1+R2, R1+R2+$\Delta$R1, R1+R2+$\Delta$R2, or R1+R2+$\Delta$R1+$\Delta$R2. As long as $\Delta$R1 is detectably different than $\Delta$R2, four different resistance states and, therefore, four different logic levels can be read.

Figure 4E:
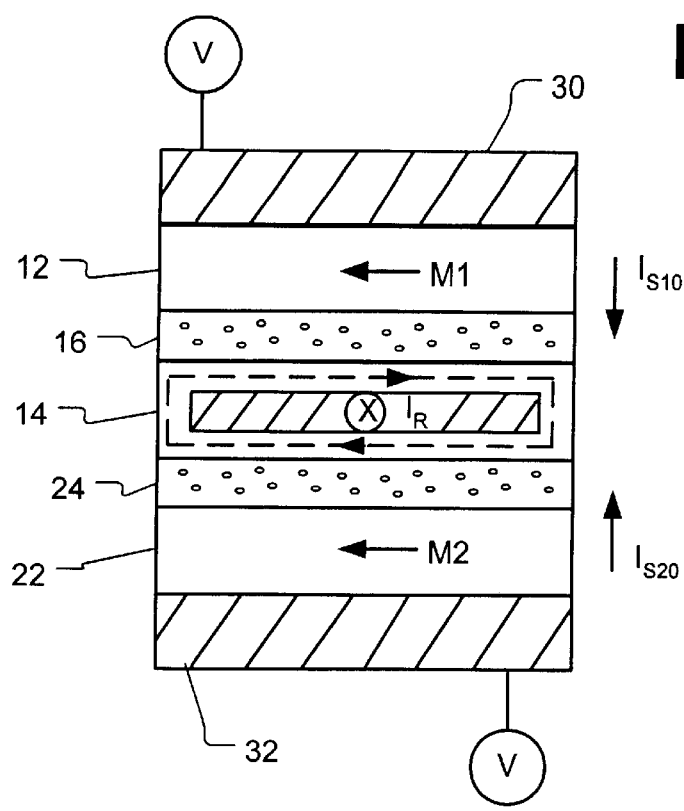
Figure 4F:
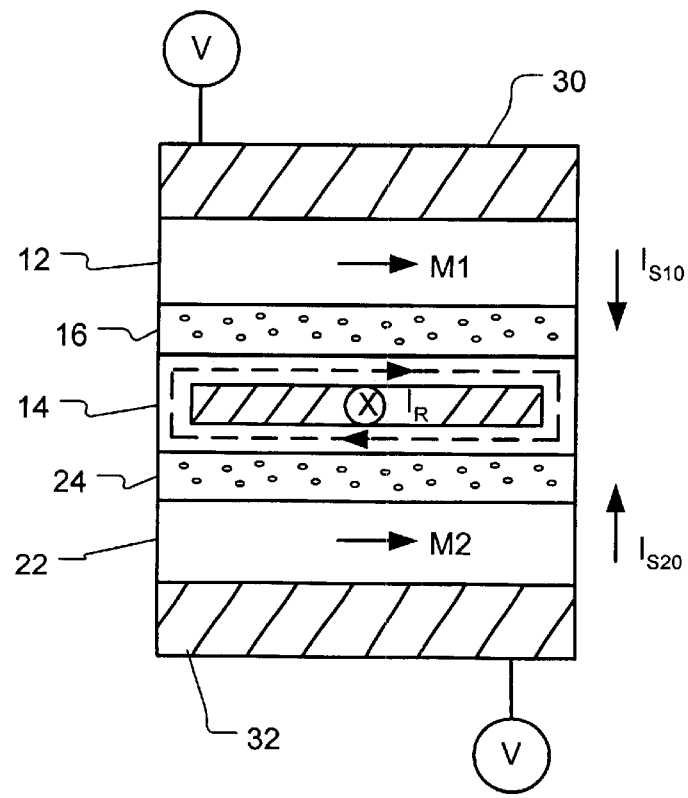

Referring to FIGS. 4e and 4f, read operations for the bit-bitbar configuration may be performed by supplying a read current ($I_R$) to the third conductor 34, simultaneously applying voltages (V) across both magnetic tunnel junctions 10 and 20, simultaneously sensing the currents ($I_{S10}+I_{S20}$) flowing through both magnetic tunnel junctions 10 and 20, and comparing the sensed currents ($I_{S10}+I_{S20}$). The read current ($I_R$) causes a magnetic field ($H_3$) about the third conductor 34 and causes the reference layer magnetization vector (M3) to assume a known orientation. As shown in FIG. 4e, the magnetization orientation of the first magnetic tunnel junction 10 is anti-parallel, and the magnetization orientation of the second magnetic tunnel junction 20 is parallel. Therefore, the resistance of the first magnetic tunnel junction 10 is greater than the resistance of the second magnetic tunnel junction 20, and the sensed current ($I_{S10}$) for the first magnetic tunnel junction 10 is greater than the sensed current ($I_{S20}$) for the second magnetic tunnel junction 20. A comparison of the sense currents ($I_{S10}$ and $I_{S20}$) indicates that the device 8 stores a logic '1'.

As shown in FIG. 4f, the magnetization orientation of the first magnetic tunnel junction 10 is parallel, and the magnetization orientation of the second magnetic tunnel junction 20 is anti-parallel. Therefore, the resistance of the first magnetic tunnel junction 10 is less than the resistance of the second magnetic tunnel junction 20, and the sensed current ($I_{S10}$) for the first magnetic tunnel junction 10 is less than the sensed current ($I_{S20}$) for the second magnetic tunnel junction 20. A comparison of the sense currents ($I_{S10}$ and $I_{S20}$) indicates that device 8 stores a logic '0'.

Figure 5:
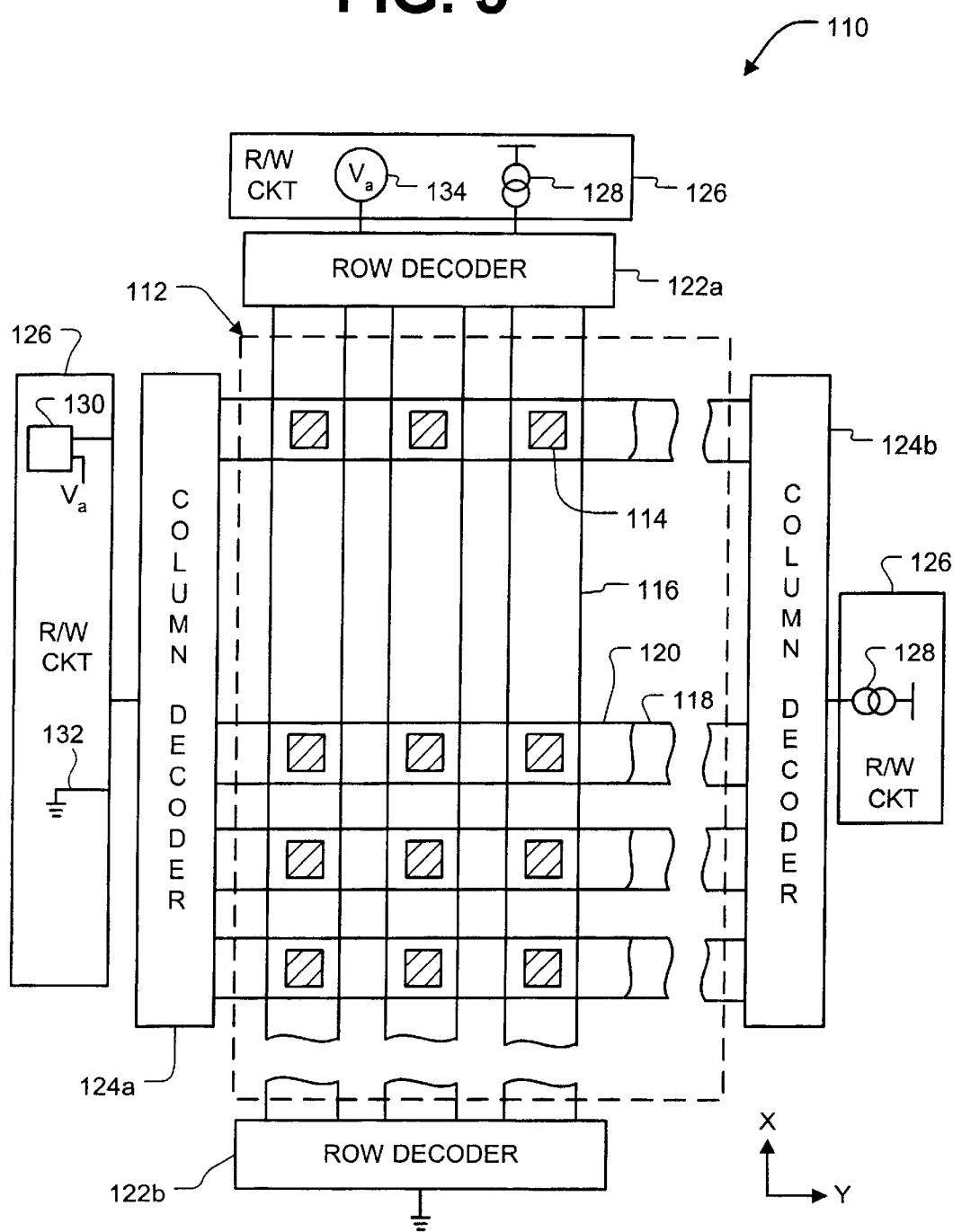
FIG. 5 is an illustration of an MRAM device according to an embodiment of the present invention.

Reference is now made to FIG. 5, which illustrates an MRAM device 110. The MRAM device 110 includes an array 112 of memory cells 114. Each memory cell 114 includes first and second magnetic tunnel junctions 10 and 12. The memory cells 114 are arranged in rows and columns, with the rows extending along an x-direction and the columns extending along a y-direction. Only a relatively small number of the memory cells 114 is shown to simplify the illustration of the MRAM device 110. In practice, arrays of any size may be used.

Word lines 116 extend along the x-direction. Each word line 116 includes a third conductor 34 that is clad with ferromagnetic material 36. Each word line 116 is in contact with a row of first insulating tunnel barriers 16 (of first magnetic tunnel junctions 10) and a row of second insulating tunnel barriers 24 (of second magnetic tunnel junctions 20). First and second bit lines 118 and 120 extend along the y-direction. Each first bit line 118 includes a first conductor 30 that is in contact with a column of first data layers 12 (of first magnetic tunnel junctions 10). Each first magnetic tunnel junction 10 is located at a cross point of a word line 116 and a first bit line 118. Each second bit line 120 includes a second conductor 32 that is in contact with a column of second data layers 22 (of second magnetic tunnel junctions 20). Each second magnetic tunnel junction 20 is located at a cross point of a word line 116 and a second bit line 120.

The MRAM device 110 further includes first and second row decoders 122a and 122b, first and second column decoders 124a and 124b, and a read/write circuit 126. The decoders 122a, 122b, 124a and 124b select word and bit lines 116, 118 and 120 during read and write operations. A selected first magnetic tunnel junction 10 lies at the cross point of a selected word line 116 and a selected first bit line 118. A selected second magnetic tunnel junction 20 lies at the cross point of a selected word line 116 and a selected second bit line 120.

The read/write circuit 126 includes current sources 128 for supplying write currents to selected word and bit lines 116, 118 and 120 during write operations. The current sources 128 also supply the read currents during read operations. The read/write circuit 126 includes sense amplifiers 130, ground connections 132, and a voltage source 134 for applying voltages during read operations.

The read/write circuit 126 can be configured to perform either dual-bit or bit-bitbar operations. During a write operation for a bit-bitbar configuration, the read/write circuit 126 writes a logic value to one of the magnetic tunnel junctions 10 and 20 of a selected memory cell 114, and writes the compliment of the logic value to the other of the magnetic tunnel junctions 10 and 20. During a write operation for a dual-bit configuration, the read/write circuit 126 writes separate logic values to the first and second magnetic tunnel junctions 10 and 20 of a selected memory cell 114.

Figure 6A:
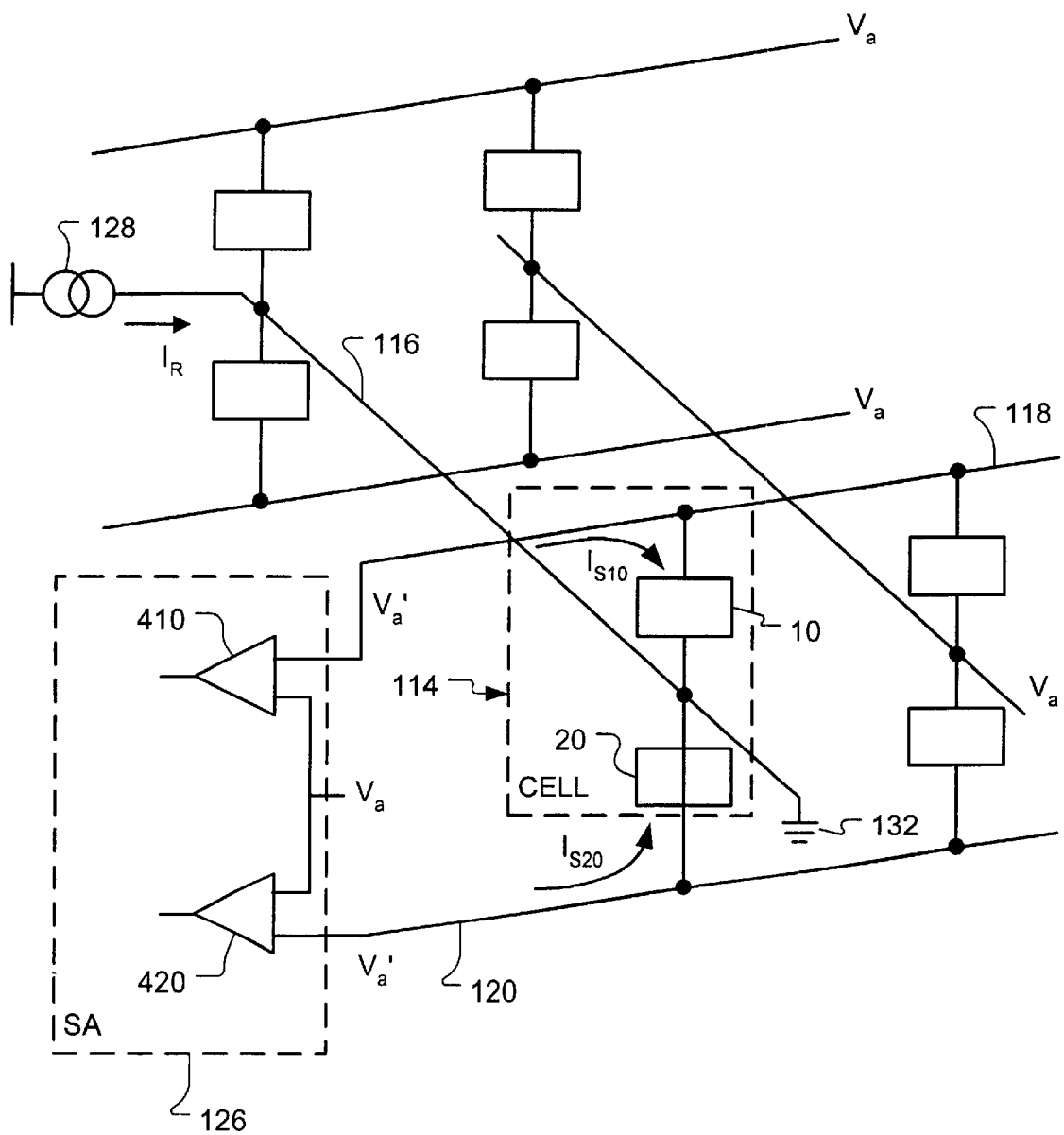
FIGS. 6a, 6b and 6c are illustrations of methods for reading an MRAM device according to embodiments of the present invention.

Reference is now made to FIG. 6a, which illustrates a read operation for both dual-bit and bit-bitbar configurations. A word line 116 is selected by connecting it between a current source 128 and a ground connection 132. First and second bit lines 118 and 120 are selected by connecting them to first inputs of first and second sense amplifiers 410 and 420. An array voltage ($V_a$) is applied to second inputs of the first and second sense amplifiers 410 and 420, causing a voltage ($V_a'$) to appear at the second inputs. This voltage ($V_a'$), which is about equal to the array voltage ($V_a$) causes sense currents ($I_{S10}$ and $I_{S20}$) to flow. The first sense current ($I_{S10}$) flows from the first amplifier 410, though the first magnetic tunnel junction 10, and to the ground connection 132. The second sense current ($I_{S20}$) flows from the second amplifier 420, though the second magnetic tunnel junction 20, and to the ground connection 132. Each sense amplifier 410 and 420 generates an output voltage that is proportional to the sense current at its first input.

In the alternative, the selected first and second bit lines 116 and 118 may be multiplexed to a single sense amplifier. The single sense amplifier would make two separate readings.

For the dual-bit configuration, a first comparator may be used to compare the output of the first sense amplifier 410 to a reference voltage. A first logic value is inferred if the output of the first sense amplifier 410 is greater than the reference voltage, and a second logic value is inferred if the output of the first sense amplifier 410 is greater less the reference voltage. The logic value of the second magnetic tunnel junction 20 can be determined in a similar manner.

For the bit-bitbar configuration, the outputs of the sense amplifiers 410 and 420 may be compared by a comparator. An output of the comparator indicates whether the resistance state of the first magnetic tunnel junction 10 is greater than the resistance state of the second magnetic tunnel junction 20. If the output of the first sense amplifier 410 is greater than the output of the second sense amplifier 420, a first logic value is inferred. If the output of the first sense amplifier 410 is less than the output of the second sense amplifier 420, a second logic value is inferred. A differential sense amplifier may be used instead of the comparator and the first and second sense amplifiers 410 and 420.

In the array 112, the magnetic tunnel junctions 10 and 20 are coupled together through many parallel paths. The resistance seen at one cross point equals the resistance of the magnetic tunnel junction 10 at that cross point in parallel with resistances of magnetic tunnel junctions 10 and 20 in the other rows and columns and the magnetic tunnel junctions. Thus the array 112 of magnetic tunnel junctions 10 may be characterized as a two-level cross point resistor network.

Because the magnetic tunnel junctions 10 and 20 are connected as a cross point resistor network, parasitic or sneak path currents can interfere with the read operations on selected magnetic tunnel junctions 10 and 20. Blocking devices such as diodes or transistors may be connected to the magnetic tunnel junctions 10 and 20. These blocking devices can block the parasitic currents.

In the alternative, the parasitic currents may be dealt with by using a variation of an "equipotential" method disclosed in assignee's U.S. Pat. No. 6,259,644. The equipotential method disclosed in U.S. Pat. No. 6,259,644 involves applying a potential to a selected line, and providing the same potential to a subset of unselected bit lines and unselected word lines. The parasitic currents are shunted so as not to interfere with the sense currents.

According to one embodiment of the present invention, the equipotential method may be applied to the array as follows. The selected word line 116 is set to the array voltage ($V_a$), and the selected bit lines 118 and 120 are connected to ground 132, whereby sense currents ($I_{S10}$, $I_{S20}$) flow through the first and second magnetic tunnel junctions 10 and 20. The array voltage (Va) is also applied to all unselected word and bit lines 116, 118 and 120. Consequently, parasitic currents do not interfere with the sense currents.

Figure 6B:
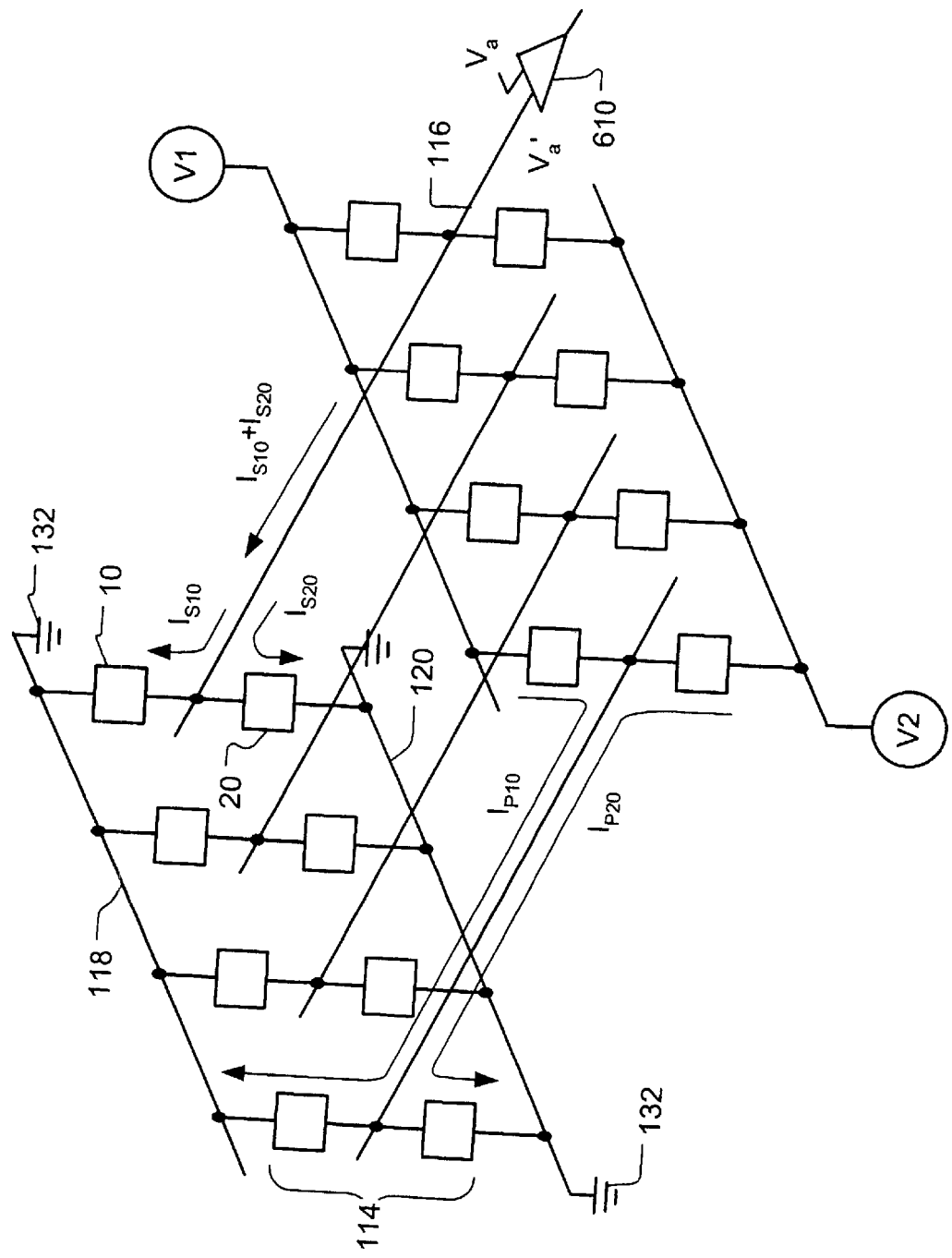

Another embodiment of the equipotential method is shown in FIG. 6b. In this embodiment each memory cell 114 of an array 112 has four detectable resistance states ($R_1+R_2$, $R_1+R_2+\Delta R_1$, $R_1+R_2+\Delta R_2$, and $R_1+R_2+\Delta R_1+\Delta R_2$). An array voltage ($V_a$) is applied to a first input of a sense amplifier 610, and the selected word line 116 is connected to a second input of the sense amplifier 610. The second input of the sense amplifier 610 couples the voltage ($V_a'$) to the selected word line 116, where $V_a'=V_a$. The selected bit lines 118 and 120 are connected to ground 132. Sense currents ($I_{S10}$, $I_{S20}$) flow through the first and second magnetic tunnel junctions 10 and 20. The sense amplifier 610 determines the resistance state of the selected memory cell 114 by generating an output voltage that is proportional to the total current ($I_{S10}+I_{S20}$) on the word line 116.

To minimize parasitic currents, a voltage V1 is applied to all upper unselected bit lines 118, and a voltage V2 is applied to all lower unselected bit lines 120. All unselected word lines 116 are allowed to float. Parasitic currents ($I_{P10}$ and $I_{P20}$) flow though the junctions 10 and 20 to which the voltages V1 and V2 are applied. The voltages V1 and V2 may be set to the array voltage ($V_a$), whereby V1=V2=$V_a$.

Figure 6C:
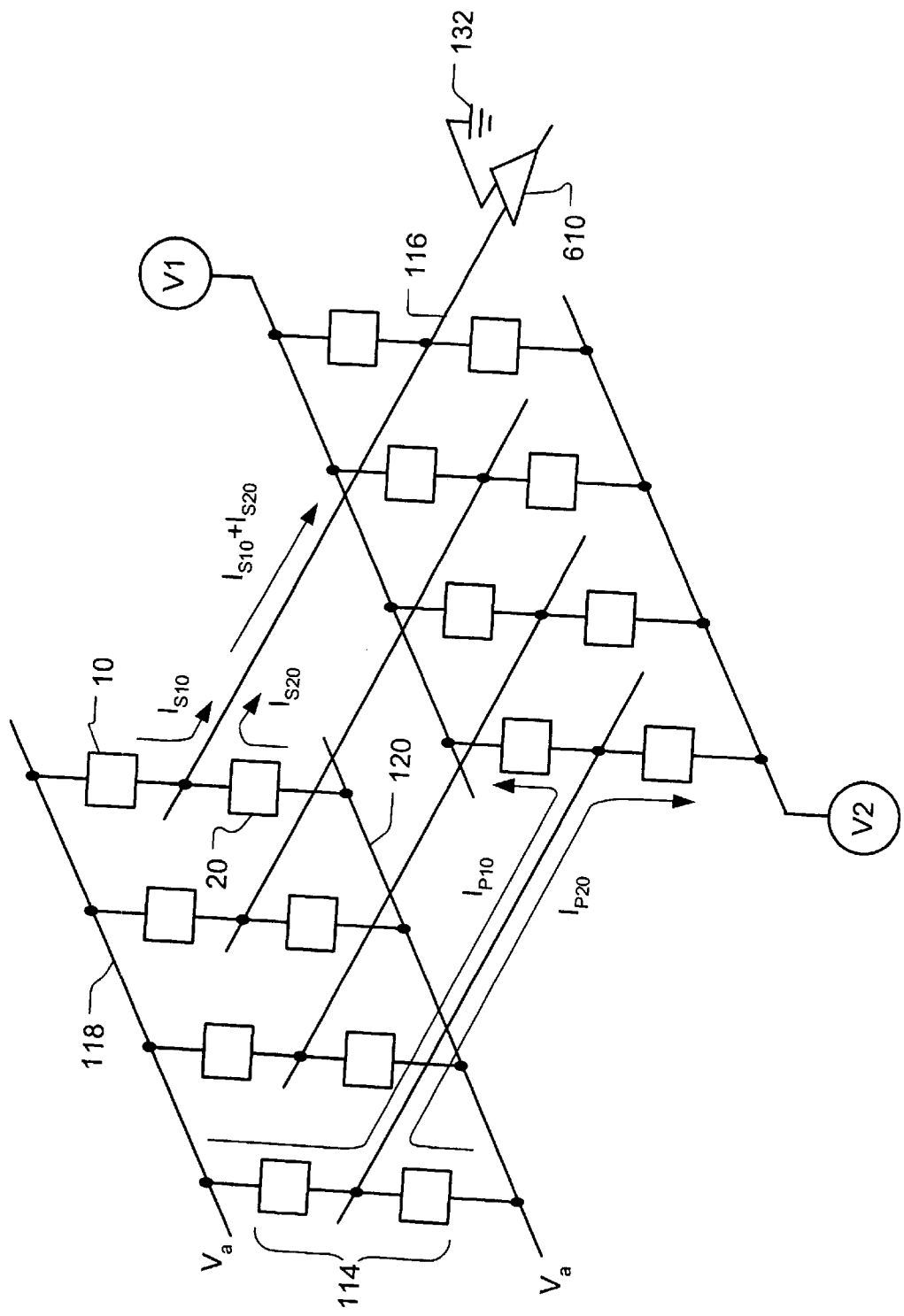

FIG. 6c shows another embodiment in which each memory cell 114 of an array 112 has four detectable resistance states. First and second inputs of a sense amplifier 610 are connected to ground (GND) and a selected word line 116, respectively. The array voltage ($V_a$) is applied to the selected bit lines 118 and 120. A voltage V1 is applied to all upper unselected bit lines 118, and a voltage V2 is applied to all lower unselected bit lines 120. V1=V2=GND. In the alternative, V1=$\epsilon$ and V2=$-\epsilon$, where $\epsilon$ is a small potential of only a few (e.g., tens of) millivolts above ground (GND). Thus, GND<$\epsilon$<<Va. By biasing the upper and lower parts of the array in this manner, the parasitic currents ($I_{P10}$, $I_{P20}$) do not to interfere with the sense currents.

Figure 7:
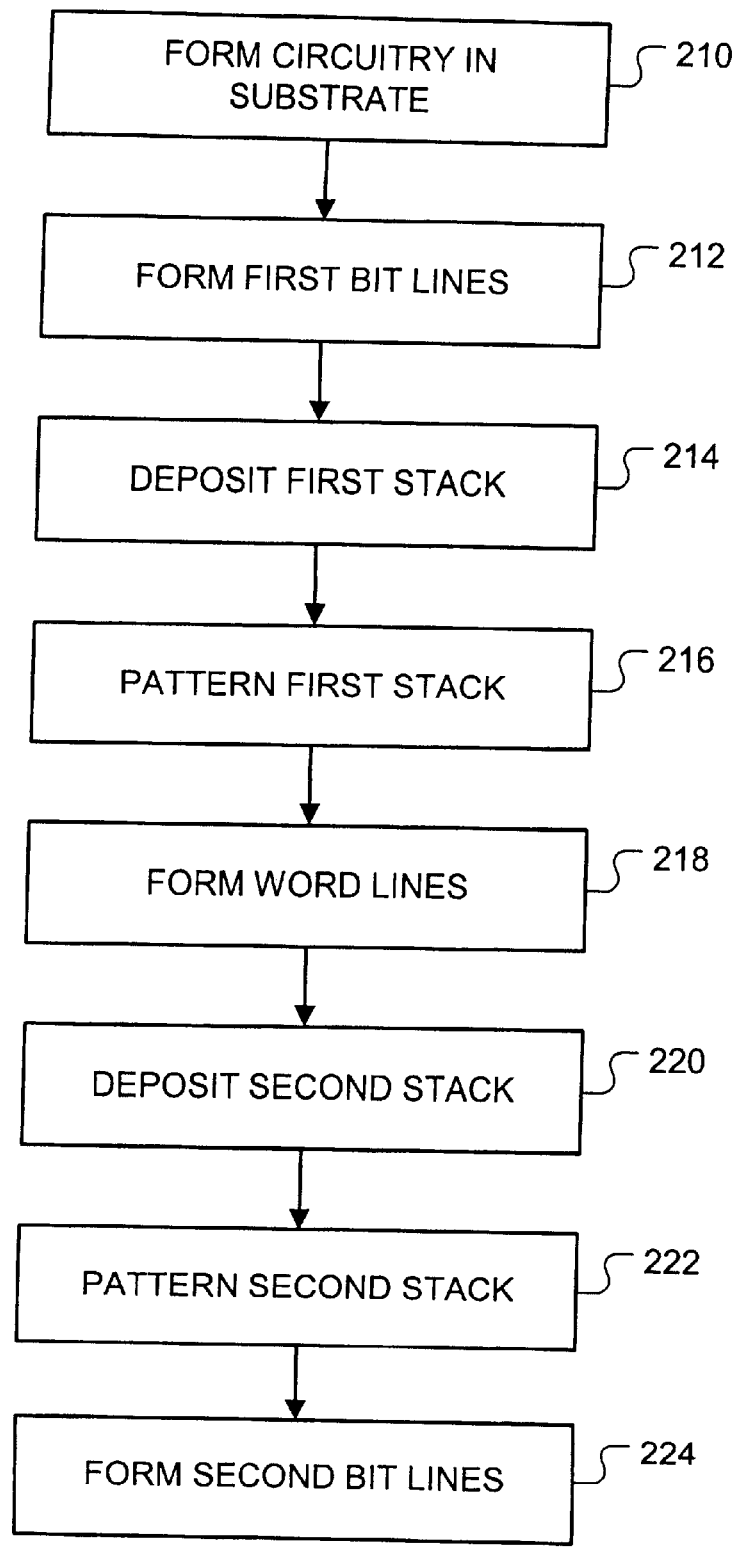
FIG. 7 is an illustration of an exemplary method of fabricating an MRAM device.

FIG. 7 illustrates an exemplary method of forming the MRAM device 110. Circuitry including row decoders 122a and 122b, column decoders 124a and 124b, and the read/write circuit 126 are formed in a substrate (block 210). Columns of first bit lines 118 are deposited on the substrate (block 212). Spaces between the first bit lines 118 are filled with a dielectric.

A first stack of magnetic material is deposited (block 214). The stack includes ferromagnetic material on the first bit lines 118, and insulating tunnel barrier material on the ferromagnetic material. The first stack is patterned into bits (block 216), and spaces between the bits are filled with dielectric material.

Word lines 116 are formed on the patterned first stack (block 218), and spaces between the word lines 116 are filled with dielectric material. Interconnects (e.g., vias) to the circuitry in the substrate are also formed. Fabrication of the word lines 116 will be described in greater detail below.

A second stack of magnetic material is deposited (block 220). The stack includes ferromagnetic material on the word lines 116, and insulating tunnel barrier material on the ferromagnetic material. The second stack is patterned into bits (block 222), and spaces between the bits are filled with dielectric material.

The second bit lines 120 are formed on the patterned second stack (block 224), and spaces between the second bit lines 120 are filled with dielectric material. Interconnects (e.g., vias) to the circuitry in the substrate are also formed.

Figure 8:
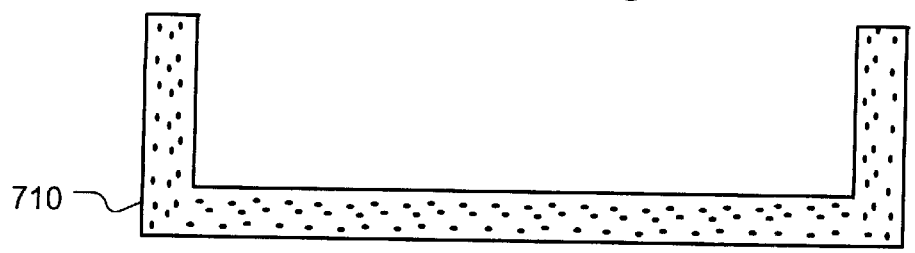
FIGS. 8–11 are illustrations of a clad conductor according to a first embodiment of the present invention, the clad conductor shown during different stages of fabrication.
Figure 9:
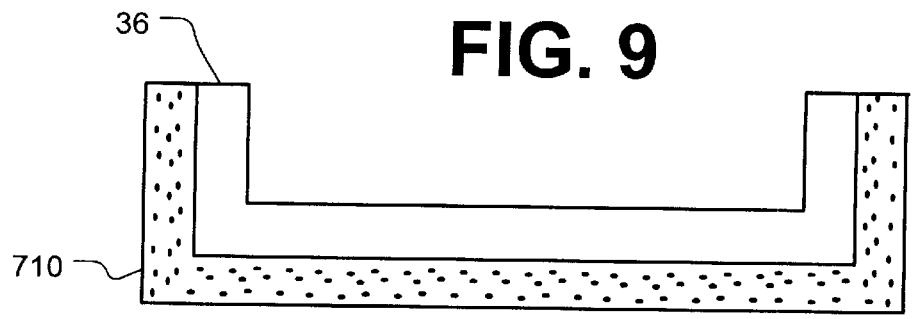
Figure 10:
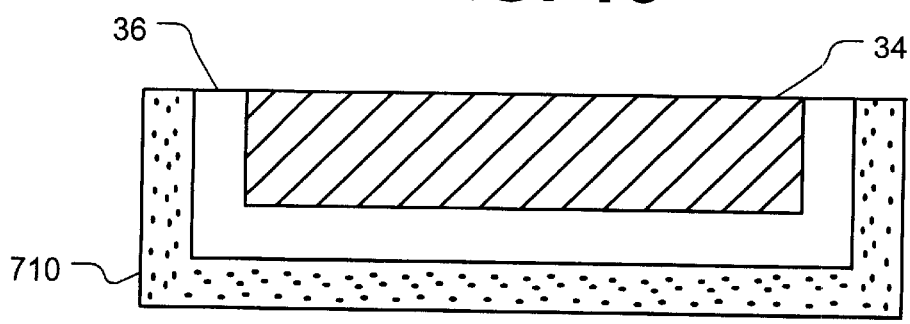
Figure 11:
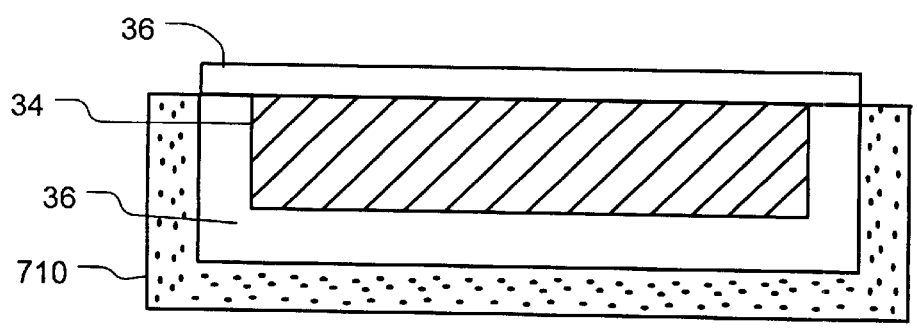

Reference is now made to FIGS. 8–11, which illustrate a Cu-damascene process for fabricating a word line 116. A trench 310 is etched in dielectric that is formed on the first stack (FIG. 8). A thin layer of ferromagnetic material 36 is deposited with an isotropic process so that the side walls of the trench 310 are coated to roughly the same thickness as the bottom of the trench 310 (FIG. 9). The ferromagnetic material is permeable enough to act as a magnetic core, and it is continuous all around in cross-sections without any breaks or too many voids. The trench 310 is then filled with copper 34 by electroplating or other suitable means. The structure is then planarized. The planarized structure is shown in FIG. 10. A layer of ferromagnetic material 36 is deposited on the planarized structure (FIG. 11). The magnetic properties may be manipulated as desired by making the thickness of the layer different than the thickness of the ferromagnetic material covering the sidewalls and bottom of the trench.

Although the word line 116 is shown as being fully clad (i.e., clad on its top, bottom and sides), it is not so limited. The word line may be partially clad instead.

Figure 12:
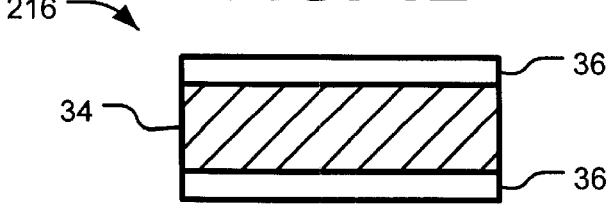
FIG. 12 is an illustration of a clad conductor according to a second embodiment of the present invention.

Reference is now made to FIG. 12, which shows an example of a partially clad word line 216. Only the top and bottom of a copper core 34 are clad with ferromagnetic material 36. The top and bottom cladding functions as data layers.

Although the present invention was described in connection with magnetic tunnel junctions, it is not so limited. The present invention may be applied to other types of magneto-resistive devices that have similar operational characteristics. For instance, the present invention may be applied to giant magneto-resistive (GMR) devices. A GMR device has the same basic configuration as a TMR device, except that data and reference layers are separated by a conductive non-magnetic metallic layer instead of an insulating tunnel barrier. Exemplary spacer layer metals include gold, silver and copper. The relative orientations of the data and reference magnetization vectors affect in-plane resistance of a GMR device.

The present invention is not limited to GMR and TMR devices. For instance, the present invention may be applied to top and bottom spin valves.

Although several specific embodiments of the present invention have been described and illustrated, the present invention is not limited to the specific forms or arrangements of parts so described and illustrated. Instead, the present invention is construed according to the claims the follow.

What is claimed is:

1. A method of using a magneto-resistive device including a conductor clad with ferromagnetic material, first and second spacer layers on opposite sides of the clad conductor, a first ferromagnetic layer on the first spacer layer, and a second ferromagnetic layer on the second spacer layer, the method comprising reading the magneto-resistive device by supplying a read current to the clad conductor, causing a first current to flow through the first ferromagnetic layer, and causing a second current to flow through the second ferromagnetic layer.

2. The method of claim 1, further comprising measuring total current on the clad conductor.

3. The method of claim 1, further comprising measuring the first and second currents and comparing the measurements to each other.

4. The method of claim 1, further comprising measuring the first and second currents; and comparing the measurements to thresholds.

5. The method of claim 1, wherein the first ferromagnetic layer, the first spacer layer, and the clad conductor form a first memory cell bit; wherein the second ferromagnetic layer, the second spacer layer, and the clad conductor form a second memory cell bit; the method further comprising writing a logic value to the magneto-resistive device by writing the logic value to one of the bits and the complement to the other of the bits; wherein during a read operation, the first and second currents flow through the bits, the first and second currents are measured, and the measurements are compared to each other to determine the logic value.

6. The method of claim 1, wherein the first ferromagnetic layer, the first spacer layer, and the clad conductor form a first memory cell bit; wherein the second ferromagnetic layer, the second spacer layer, and the clad conductor form a second memory cell bit; the method further comprising writing independently to both bits; resistance states of both bits determined when the magneto-resistive device is read.

7. The method of claim 1, wherein the first ferromagnetic layer, the first spacer layer, and the clad conductor form a first memory cell bit; wherein the second ferromagnetic layer, the second spacer layer, and the clad conductor form a second memory cell bit; the magneto-resistive device having at least four possible distinct resistance states, wherein the first and second currents are caused to flow by applying a voltage across the magneto-resistive device; and wherein the first and second currents are measured to determine a resistance state of the magneto-resistive device.

8. A method of writing to a memory cell including a conductor clad with ferromagnetic material, first and second spacer layers on opposite sides of the clad conductor, a first data layer on the first spacer layer, and a second data layer on the second spacer layer, a first conductor on the first data layer and a second conductor on the second data layer, the method comprising supplying first and second write currents to the first and second conductors simultaneously, and a third write current to the third conductor with a small time delay.

9. A magneto-resistive device comprising:

a conductor clad with ferromagnetic material;

first and second spacer layers on opposite sides of the clad conductor;

a first ferromagnetic layer on the first spacer layer, the first ferromagnetic layer having a first magnetization vector; and a second ferromagnetic layer on the second spacer layer, the second ferromagnetic layer having a second magnetization vector.

10. The device of claim 9, wherein the first and second spacer layers are insulating tunnel barriers.

11. The device of claim 9, wherein the conductor is fully clad.

12. The device of claim 9, wherein only top and bottom surfaces of the conductor are clad.

13. The device of claim 9, wherein the clad conductor is magnetically soft.

14. The device of claim 9, wherein coercivity of the first and second ferromagnetic layers is substantially higher than coercivity of the clad conductor.

15. The device of claim 9, wherein the first and second ferromagnetic layers are made of a ferromagnetic material that is different than the cladding on the conductor.

\* \* \* \* \*